(12) United States Patent
Yanagisawa et al.

(10) Patent No.: US 7,780,344 B2
(45) Date of Patent: Aug. 24, 2010

(54) METHOD FOR EVALUATING THE DETERIORATION OF MAGNETO-RESISTIVE EFFECT DEVICE

(75) Inventors: Takumi Yanagisawa, Tokyo (JP); Naoki Ohta, Tokyo (JP); Yosuke Antoku, Tokyo (JP)

(73) Assignee: TDK Corporation, Tokyo (JP)

( * ) Notice: Subject to any disclaimer, the term of this patent is extended or adjusted under 35 U.S.C. 154(b) by 209 days.

(21) Appl. No.: 11/860,811

(22) Filed: Sep. 25, 2007

(65) Prior Publication Data

US 2009/0080491 A1    Mar. 26, 2009

(51) Int. Cl.
G01N 3/60    (2006.01)
G01N 25/72    (2006.01)

(52) U.S. Cl. .................................. 374/57; 374/5; 374/7
(58) Field of Classification Search ...................... 374/5, 374/7, 57
See application file for complete search history.

(56) References Cited

U.S. PATENT DOCUMENTS 5,602,820 A * 2/1997 Wickramasinghe et al. . 369/126

7,507,020 B2 * 3/2009 Jayaram et al. ................. 374/7
2002/0191672 A1 * 12/2002 Abraham et al. ............. 374/141

FOREIGN PATENT DOCUMENTS

| JP | 2001-67619 | 3/2001 |
| JP | 2002-312912 | 10/2002 |
| JP | 2005-108306 | 4/2005 |

* cited by examiner

*Primary Examiner*—Gail Verbitsky
*Assistant Examiner*—Mirellys Jagan
(74) *Attorney, Agent, or Firm*—Oblon, Spivak, McClelland, Maier & Neustadt, L.L.P.

(57) ABSTRACT

The estimation method of the invention for estimating the deteriorations of a magneto-resistive effect device by heat shocks involves applying heat shocks by laser irradiation to a structure including a thin-film magnetic head comprising a magneto-resistive effect device to propagate them to the magneto-resistive effect device, thereby causing the deteriorations of the magneto-resistive effect device. Thus, (1) the deterioration mode phenomenon of "local overheating plus vibration" can be imitated in a simple yet very approximate state so that a device likely to undergo characteristics deteriorations due to the thermal asperity problem can be detected early at an initial fabrication process stage, and (2) what specifications a head device structure less likely to offer the thermal asperity problem is in can be judged at a product development stage.

8 Claims, 8 Drawing Sheets

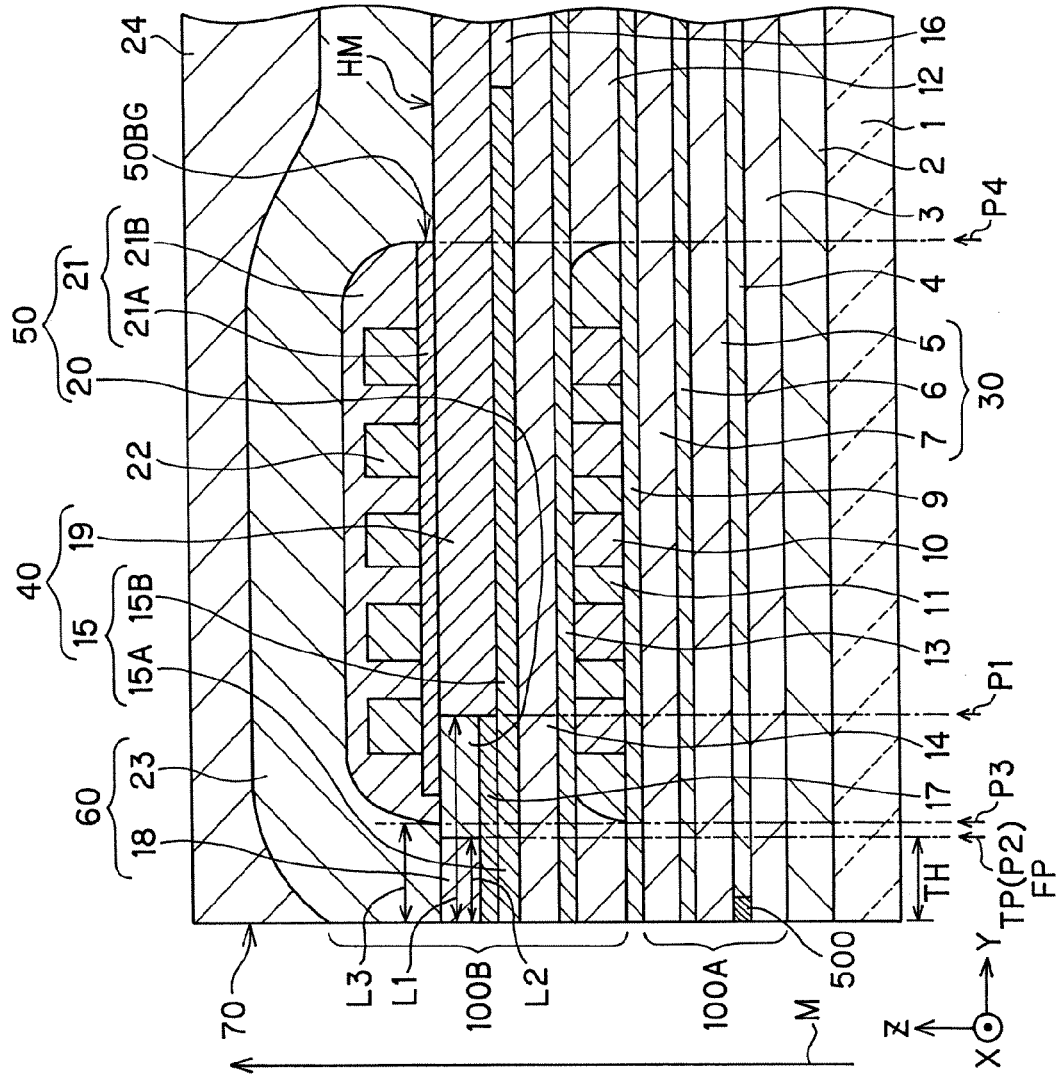
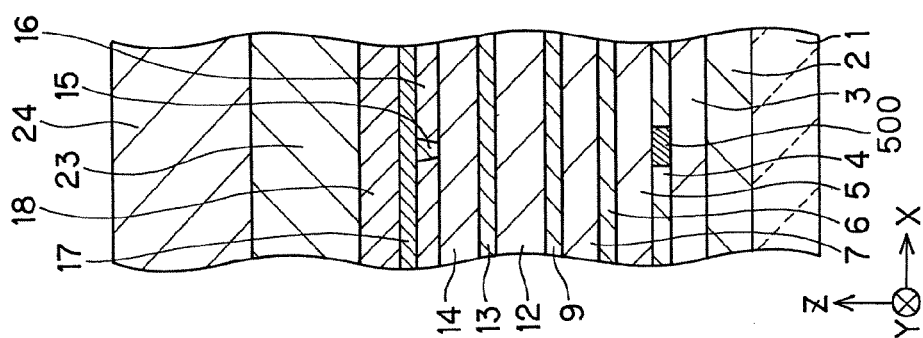
FIG. 3A
FIG. 3B

METHOD FOR EVALUATING THE DETERIORATION OF MAGNETO-RESISTIVE EFFECT DEVICE

BACKGROUND OF THE INVENTION

1. Field of the Invention

The present invention relates to a method of estimating the deteriorations of a reproducing device of a thin-film magnetic head wherein heat shocks are applied to that reproducing device using a laser to give rise to a phenomenon imitating the so-called "thermal asperity" defect.

2. Explanation of the Prior Art

With recent improvements in the plane recording density of magnetic disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device tapping a giant magneto-resistive effect, a TMR device making use of a tunnel-type magneto-resistive effect, and so on.

With regard to thin-film magnetic heads having various such magneto-resistive effect devices mounted on them, it has been reported that there is often the thermal asperity defect caused as an inherent one (see JP(A)2005-108306).

The thermal asperity is a phenomenon that occurs when a thin-film magnetic head passes over a magnetic disk plane that is a recording medium while levitating and flying over minute bumps or dents, because the magneto-resistive effect device is heated or cooled via the adiabatic compression and/or adiabatic expansion of air.

Of course, that phenomenon occurs not only in a non-contact state but also in a contact state where the magneto-resistive effect device is in contact with minute bumps or dents on the magnetic disk plane. When the head is in collision with minute asperities, there is a local, vigorous heating occurring due to mechanical vibrations and, at the same time, instantaneous friction. Such local heating is supposed to occur for a very short period in which the head passes over the asperities, and propagate right away to the whole device. When heat shocks propagate as if they were waves, the device is supposed to undergo repeated local expansion and local shrinkage.

How a typical deterioration by the thermal asperity occurs is now explained with reference to FIGS. 7A and 7B with an applied magnetic field as abscissa and the ensuing device resistance change as ordinate. Typical initial characteristics are shown in FIG. 7A. In the initial state with none of the deteriorations of the device, there is a liner resistance change vs. the applied magnetic field.

By contrast, FIG. 7B shows the characteristics of a device deteriorated by the thermal asperity while an HDD (hard disk drive) is practically on the run. In FIG. 7B, there is a stepwise resistance change (kink) vs. the applied magnetic field. From the experience so far, it has been found that most of the deteriorations caused by the thermal asperity occur in this mode.

In a possible deterioration model, it would appear that a part of hard bias layer is flipped over by heat shocks. A magneto-resistive effect film does not show any linearity in general, and a given magnetic field is applied to it from an externally located hard bias layer to keep the linearity of its characteristics. With a part of the bias layer flipped over, however, the bias magnetic field wanes resulting in the inability to give good enough bias magnetic field to the magneto-resistive effect device: this could render the characteristics nonlinear.

The situations being like this, it is required that in products fabrication processes, devices likely to undergo characteristics deteriorations by the thermal asperity defects be previously detected and sorted out. For the development of products, too, there is a growing demand toward a method of estimating the likelihood of characteristics deteriorations thereby achieving a structure less likely to offer the thermal asperity problem.

Never until now, however, is there any simple yet precise method that can imitate the deterioration mode of the aforesaid "local overheating plus vibration".

Such being the case, the present invention has for its object the provision of a novel estimation method of estimating the deteriorations of a magneto-resistive effect device, by which:

(1) it is possible to imitate the deterioration mode phenomenon of the "local overheating plus vibration" in simple yet very approximate state, thereby detecting a device likely to undergo characteristics deteriorations due to the thermal asperity problem early at an initial fabrication stage, and (2) it is possible to judge what specifications a device structure less likely to give rise to the thermal asperity defect is in at a products development stage.

It is here noted that the prior art that would seem pertinent to the invention of this application is JP(A)2000-312912. This prior art comes up with the temperature estimation of the electromagnetic characteristics of a magnetic head by heating it with laser light. The laser light is merely used for the purpose of increasing the temperature of the magnetic head in a non-contact state without recourse to a conventional contact heating mode. In other words, the method of JP(A)2000-312912 does never make use of laser irradiation for the purpose of imparting heat shocks to the device.

SUMMARY OF THE INVENTION

To accomplish the aforesaid object, the invention of this application provides a method for estimating deteriorations of a magneto-resistive effect device, which comprises applying a heat shock by laser irradiation to a structure including a thin-film magnetic head comprising a magneto-resistive effect device to propagate the heat shock to the magneto-resistive effect device, thereby causing deteriorations of the magneto-resistive effect device.

In a preferable embodiment of the invention, a defective is detected depending on device characteristics after said deteriorations.

In a preferable embodiment of the invention, the resistance to thermal asperity is estimated depending on changes in device characteristics before and after said deteriorations.

In a preferable embodiment of the invention, said deteriorations are applied to a wafer shape state in which multiple magneto-resistive effect devices are formed on a wafer.

In a preferable embodiment of the invention, said deteriorations are applied to a bar shape state in which multiple bars are cut out of a wafer shape state in which multiple magneto-resistive effect devices are formed on a wafer.

In a preferable embodiment of the invention, said deteriorations are applied to a slider head device state in which multiple device shapes are cut out of a bar shape.

BRIEF EXPLANATION OF THE DRAWINGS

FIG. 3A is a sectional view of the thin-film magnetic head parallel with the so-called air bearing surface (ABS), and FIG. 3B is a sectional view of the thin-film magnetic head orthogonal to the air bearing surface.

FIG. 7A is a graph indicative of an initial state of the device before the occurrence of the thermal asperity deteriorations and FIG. 7B is a graph indicative of the state of the device after the occurrence of the thermal asperity deteriorations.

FIG. 8A is indicative of a device state before the application of a laser and FIG. 8B is indicative of a device state after the application of a laser.

EXPLANATION OF THE PREFERRED EMBODIMENTS

The best mode for carrying out the invention is now explained in details.

Prior to explaining how to imitate the deteriorations of a magneto-resistive effect device by heat shocks according to the invention, reference is made to a typical arrangement of the magneto-resistive effect device to be estimated by the inventive estimation method as well as an arrangement of a thin-magnetic head comprising that magneto-resistive effect device.

It is here noted that if the magneto-resistive effect device to be estimated can function such that the state of magnetic layers changes relatively depending on an external magnetic field, there is then no particular limitation to the type and structure of the device.

[Explanation of a Typical Arrangement of the Magneto-Resistive Effect Device]

A giant magneto-resistive effect device of the CPP structure (the CPP-GMR device) is now explained as a typical example of the magneto-resistive effect device.

Figure 1:
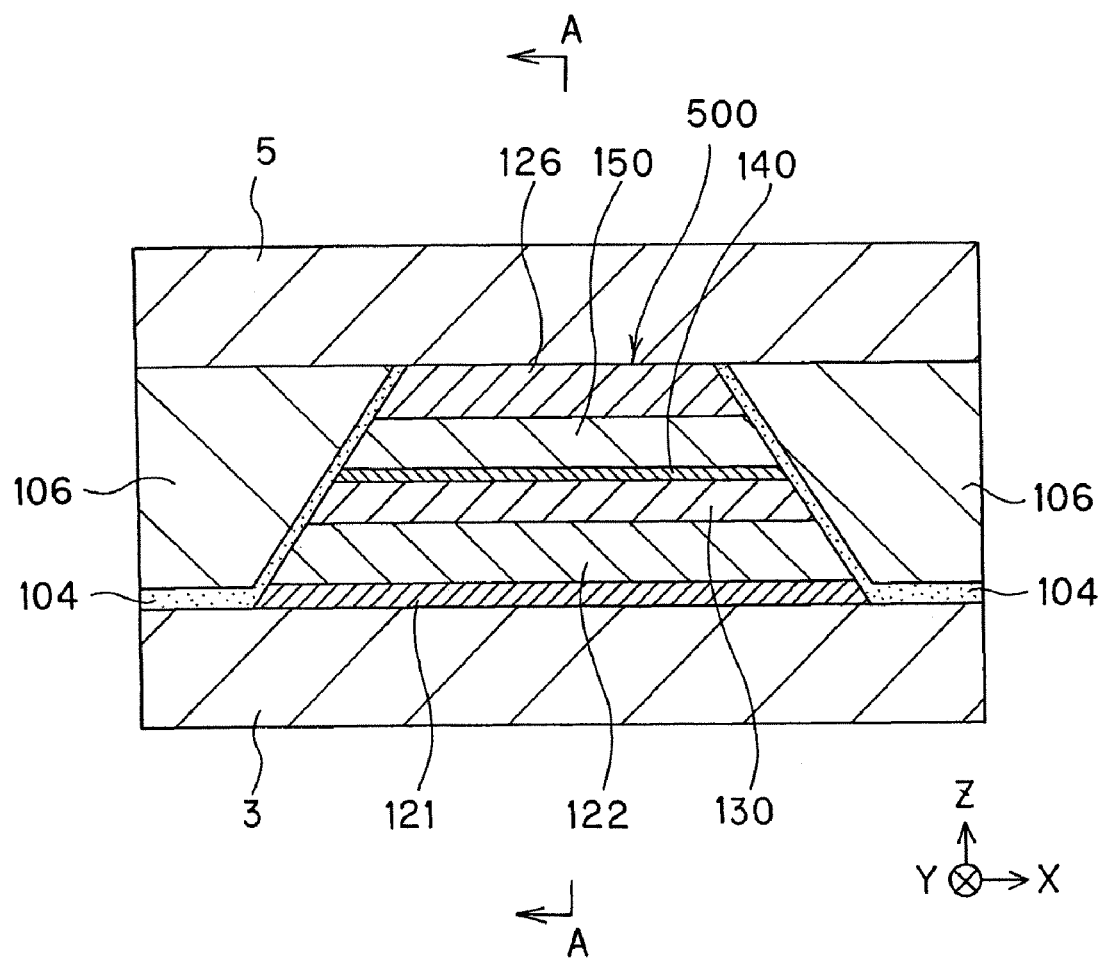
FIG. 1 is illustrative in section parallel with the medium opposite plane of an embodiment of the invention, especially the reproducing device of a reproducing head.

FIG. 1 is illustrative of the ABS (air bearing surface) of a reproducing head in an embodiment of the invention; FIG. 1 is illustrative in schematic of the ABS of the giant magneto-resistive effect device (CPP-GMR device) having the CPP structure in particular. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
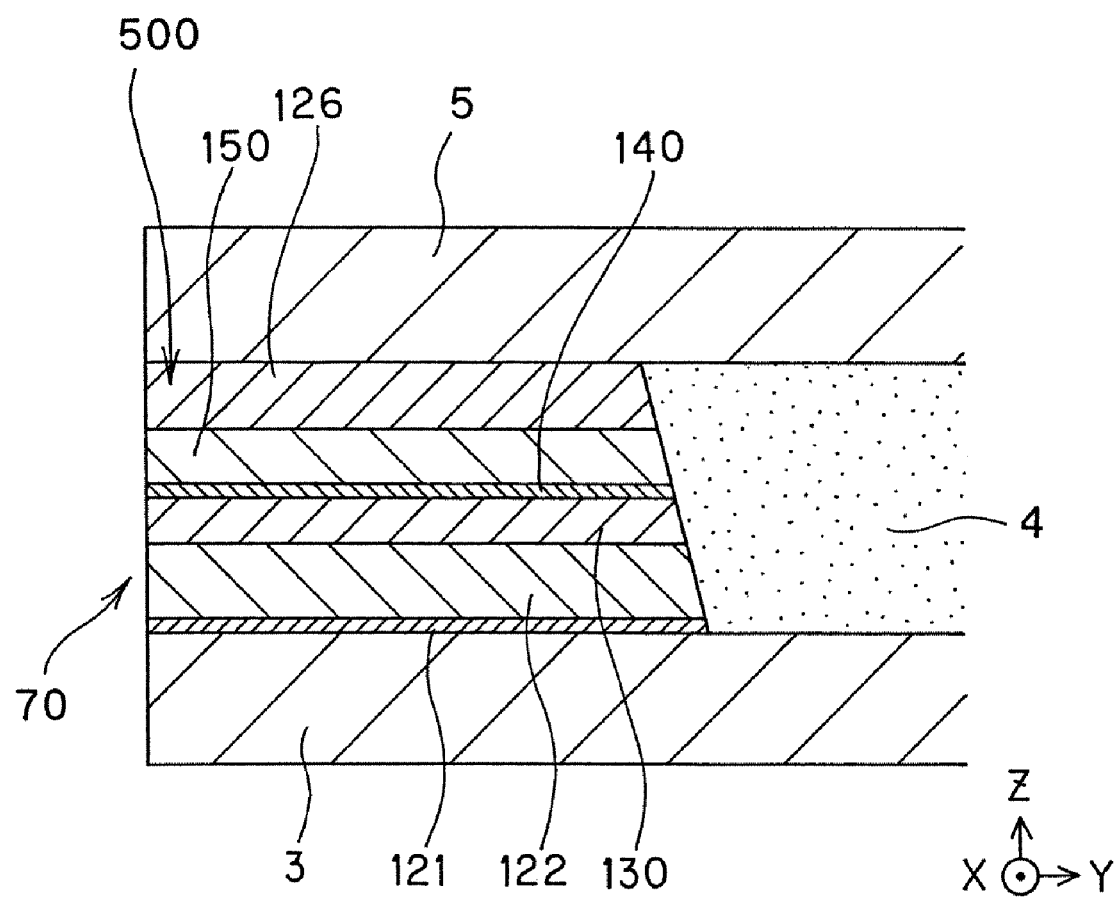
FIG. 2 is a view as taken on the arrowed A1-A1 section of FIG. 1.

FIG. 2 is a view as taken on the arrowed A-A section of FIG. 1.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

As shown in FIG. 1, the reproducing head according to the embodiment here comprises a first shield layer 3 (also called the lower shield layer 3) and a second shield layer 5 (also called the upper shield layer 5) that are located at a given space and opposed vertically on the sheet, a giant magneto-resistive effect device 500 (hereinafter referred to as the GMR device 500) inter-posed between the first shield layer 3 and the second shield layer 5, and an insulating film 104 formed directly on two sides of the GMR device 500 (see FIG. 1). Note here that in the rear (see FIG. 2) of the GMR device 500, there is a refill layer 4 formed that is an insulating layer.

Further, as shown in FIG. 1, two bias magnetic field-applying layers 106 are formed on two sides of the GMR device 500 via the insulating layer 104.

In the embodiment here, the first 3 and the second shield layer 5 take a so-called magnetic shield role plus a pair-of-electrodes role. In other words, they have not only a function of shielding magnetism but also function as a pair of electrodes adapted to pass a sense current through the GMR device 500 in a direction intersecting the plane of each of the layers forming the GMR device 500, for instance, in a direction perpendicular to the plane of each of the layers forming the GMR device 500 (stacking direction).

Apart from the first 3 and the second shield layer 5, another pair of electrodes may be additionally provided above and below the device.

Referring to the GMR device 500 having the CPP structure here in terms of a broad, easy-to-understand concept, it comprises a spacer layer 140, and a first ferromagnetic layer 130 and a second ferromagnetic layer 1540 stacked together with the spacer layer 140 sandwiched between them, as shown in FIG. 1. The first ferromagnetic layer 130 and the second ferromagnetic layer 150 function such that the angle made between the directions of magnetizations of both layers changes relatively depending on an external magnetic field.

Referring here to a typical embodiment of the invention, the first ferromagnetic layer 130 functions as a fixed magnetization layer having its magnetization fixed, and the second ferromagnetic layer 150 functions as a free layer having a direction of its magnetization changing depending on an external magnetic field, i.e., a signal magnetic field from a recording medium. It follows that the first ferromagnetic layer 130 is the fixed magnetization layer 130, and the second ferromagnetic layer 150 is the free layer 150.

The fixed magnetization layer 130 has its magnetization direction fixed under the action of an antiferromagnetic layer 122. While an embodiment with the antiferromagnetic layer 122 formed on a substrate side (the side of the first shield layer 3) is shown in FIG. 1, it is contemplated that the antiferromagnetic layer 122 may be formed on a top side (the side of the second shield layer 5) to interchange the free layer 150 and the fixed magnetization layer 130 in position.

In what follows, the layers forming the GMR device 500 are each now explained in greater details.

(Explanation of the Fixed Magnetization Layer 130)

In the invention, the fixed magnetization layer 130 is formed on the antiferromagnetic layer 122 having a pinning action via an underlay layer 121 formed on the first shield layer 3.

The fixed magnetization layer 130 may be in either a single-layer film form or a multilayer film form.

In a preferable embodiment of the invention, the fixed magnetization layer 130 has a so-called synthetic pinned layer comprising, in order from the side of the antiferromagnetic layer 122, an outer layer, a non-magnetic intermediate layer and an inner layer, all stacked together in order.

The outer layer, and the inner layer is provided by a ferromagnetic layer made of, for instance, a ferromagnetic material containing Co, and Fe. The outer layer and the inner layer are antiferromagnetically coupled and fixed such that their magnetization directions are opposite to each other.

The outer layer, and the inner layer is preferably made of, for instance, a $Co_{70}Fe_{30}$ (atomic %) alloy. The outer layer has a thickness of preferably about 3 to 7 nm, and the inner layer has a thickness of preferably about 3 to 10 nm.

For instance, the nonmagnetic intermediate layer is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions.

(Explanation of the Free Layer 150 and Cap Layer 126)

The free layer 150 has its magnetization direction changing depending on an external magnetic field, i.e., a signal magnetic field from the recording medium, and is made of a ferromagnetic layer (soft magnetic layer) having a small coercive force. The free layer 150 has a thickness of, for instance, about 2 to 10 nm, and may be in either a single layer form or a multilayer form including a plurality of stacked ferromagnetic layers.

On such free layer 150, there is a cap layer 126 (protective layer 126) formed, which comprises a Ta or Ru layer as an example, as shown in FIG. 1. The cap layer 126 has a thickness of about 0.5 to 20 nm.

(Explanation of the Nonmagnetic Spacer Layer 140)

The nonmagnetic spacer layer 140 is made of at least one or more materials selected from the group of consisting of $Al_2O_3$, MgO, Cu, Ag, Au, Pt, Al, ZnO, $SiO_2$, $TiO_2$, $ZnO_2$, HfO and so on, and has a thickness of about 1.0 to 3.0 nm.

(Explanation of the Antiferromagnetic Layer 122)

The antiferromagnetic layer 122 functioning as the pinning layer works such that by way of exchange coupling with the fixed magnetization layer 130 as described above, the magnetization direction of the fixed magnetization layer 130 is fixed.

For instance, the antiferromagnetic layer 122 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 122 has a thickness of about 5 to 30 nm.

It is here noted that for the layer for fixing the magnetization direction of the fixed magnetization layer 130, it is acceptable to use a hard magnetic layer comprising a hard magnetic material such as CoPt in place of the aforesaid antiferromagnetic layer.

The underlay layer 121 formed below the anti-ferromagnetic layer 122 is provided to improve the crystallization and orientation of each of the layers stacked on it in general, and the exchange coupling of the antiferromagnetic layer 122 and the fixed magnetization layer 130 in particular. For such underlay layer 121, for instance, a multilayer structure of Ta and NiCr layers is used. The underlay layer 121 has a thickness of about 2 to 6 nm as an example.

Further, the material that forms the insulating layer 104 shown in FIG. 1, for instance, includes alumina. For the bias magnetic field-applying layers 106, for instance, a hard magnetic layer (hard magnet) or a multilayer assembly of a ferromagnetic layer and an anti-ferromagnetic layer may be used; specifically, CoPt or CoCrPt is mentioned.

(Explanation of the Whole Structure of the Thin-Film Magnetic Head)

One preferable, exemplary whole structure of the thin-film magnetic head according to the invention is now explained with reference to FIGS. 3A, 3B, 4 and 5.

Figure 4:
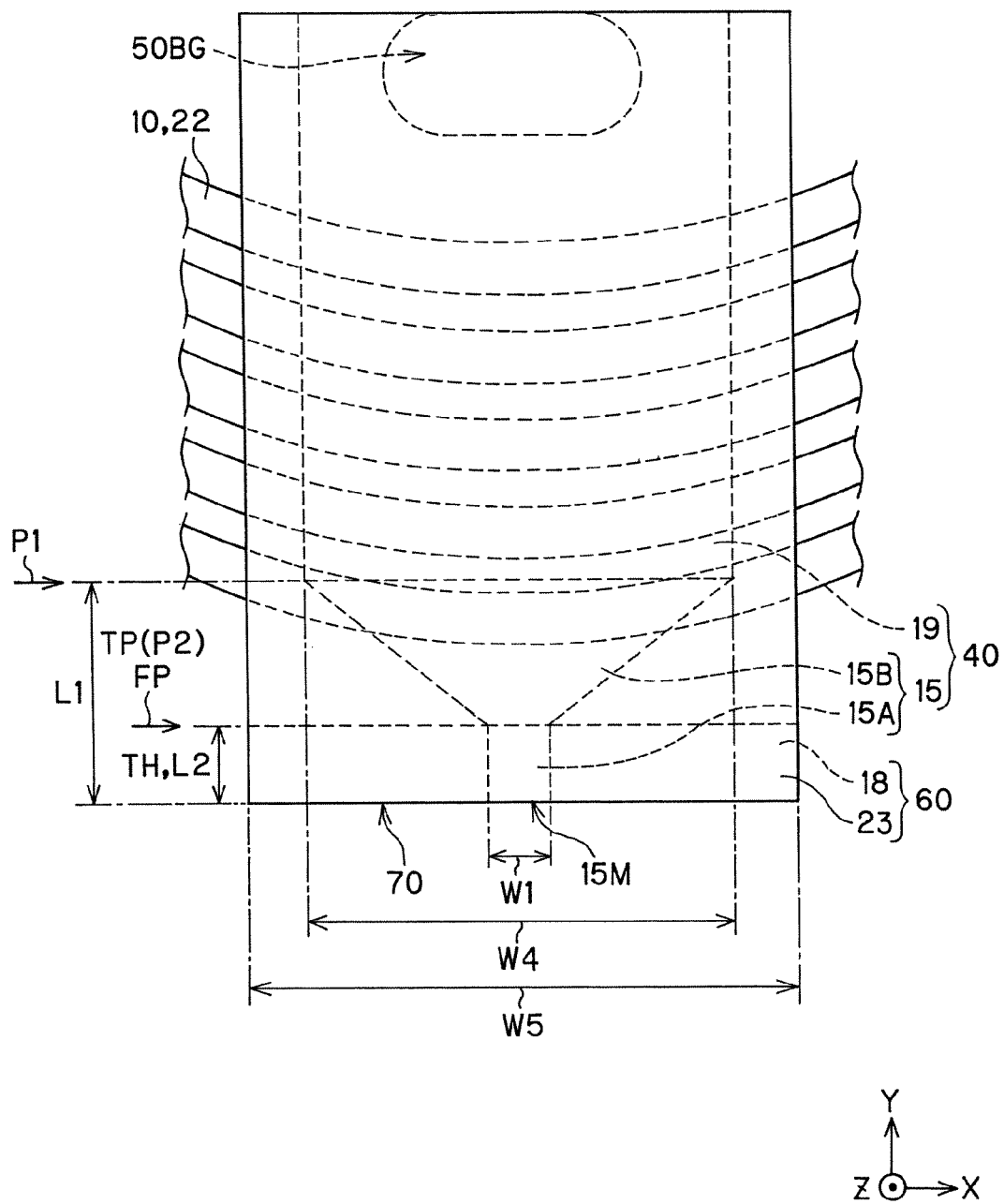
FIG. 4 is an enlarged perspective view of a portion of the write head near the magnetic pole layer.
Figure 5:
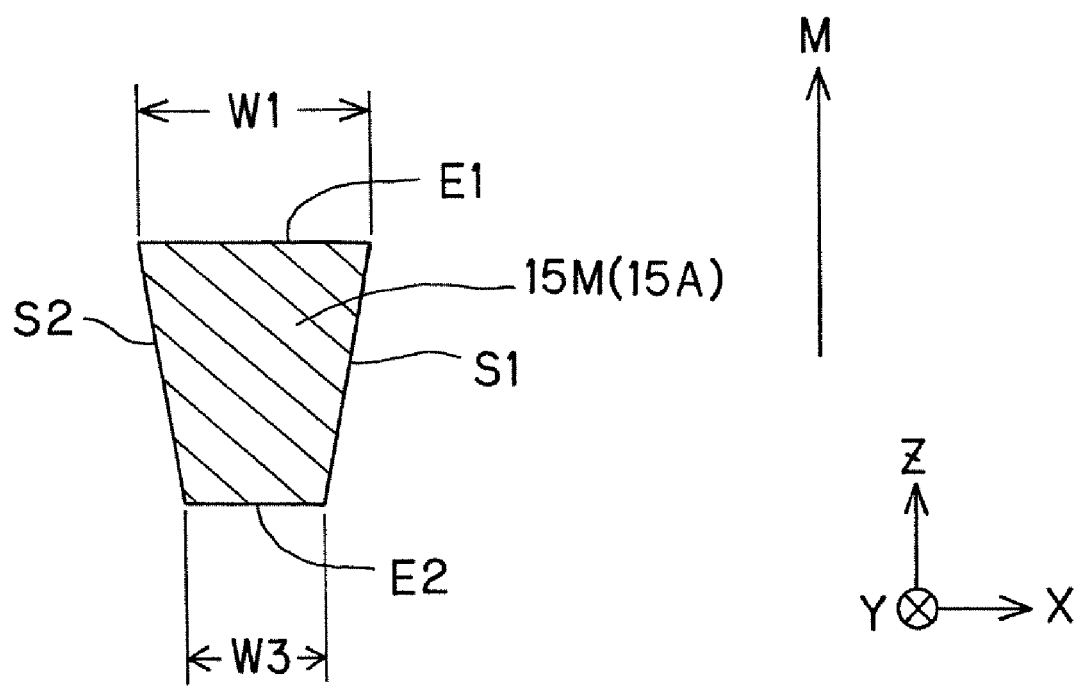
FIG. 5 is illustrative of the morphology of the end portion of the main magnetic pole at the air bearing surface.

FIG. 3A is a sectional view of the thin-film magnetic head parallel with the so-called air bearing surface (ABS), and FIG. 3B is a sectional view of the thin-film magnetic head orthogonal to the air bearing surface. The air bearing surface (ABS) here is tantamount to the plane at which the thin-film magnetic head is in opposition to the magnetic recording medium (hereinafter also called the medium opposite plane). FIG. 4 is an enlarged perspective view of a portion of the write head near the magnetic pole layer for effecting perpendicular magnetic recording, and FIG. 5 is illustrative of the morphology of the end portion of the main magnetic pole at the air bearing surface.

The thin-film magnetic head shown in FIGS. 3A and 3B is mounted on, and used with, a magnetic recording system such as a hard disk drive for the purpose of applying magnetic processing to a recording medium like a hard disk drive moving in the medium travel direction M.

For instance, the thin-film magnetic head illustrated in the drawings is a composite type head capable of implementing both recording and reproducing as magnetic processing. The structure comprises, as shown in FIG. 3, a substrate 1 made of a ceramic material, and an insulating layer 2 made of a nonmagnetic insulating material, a reproducing head portion 100A adapted to reproduce magnetic information recorded by harnessing the magneto-resistive (MR) effect, a separation layer 9 made of a nonmagnetic insulating material such as alumina, a shield type recording head portion 100B adapted to implement a perpendicular recording mode of recording processing, and an overcoat layer 24 made of a nonmagnetic insulating material, all stacked one upon another on the substrate 1 in that order.

In the embodiment illustrated, the reproducing head portion 100A has a multilayer structure comprising a lower read shield layer 3, a magneto-resistive effect device 500, and a shield layer 5 (in this embodiment, a part of an upper read shield layer 30) stacked one upon another in that order. At the rear end face of the magneto-resistive effect 500 there is a shield gap layer 4 (refill layer 4) formed.

In the embodiment shown in FIGS. 3A and 3B, both the lower 3 and the upper read shield layer 30 are provided to separate the magneto-resistive effect device magnetically from the surroundings.

In the embodiment here, the upper read shield layer 30 is divided into two shield layers 5 and 7 in its thickness direction with a nonmagnetic layer 6 held between them.

The upper first read shield layer 5 is made of a magnetic material such as permalloy. The upper second read shield layer 7 is likewise made of a magnetic material such as permalloy. The nonmagnetic layer 6 is made of a nonmagnetic material such as ruthenium (Ru) or alumina.

While it is shown and described that the upper read shield layer 30 has a multilayer structure, it is contemplated that it is not always required to have a multilayer structure; it could have a single-layer structure as is the case with the lower read shield layer 3.

The shield gap film 4, for instance, made of a nonmagnetic material such as alumina.

The recording head portion 10B, for instance, has a multilayer structure comprising a first-stage thin-film coil 10 buried around with insulating layers 11, 12, 13, a nonmagnetic layer 14, a main magnetic pole layer 40 partially buried around with an insulating layer 16, a gap layer 17, a second-stage thin-film coil 22 buried with an insulating layer 50 that forms a magnetic coupling opening (back gap 50BG) and a write shield layer 60, all stacked one upon another in order.

The thin-film coil 10 has a primary function of generating a leakage-preventive magnetic flux for holding back leakage of a recording magnetic flux produced at the thin-film coil 22.

The thin-film coil 10 typically operates such that currents flow in a direction opposite to the direction taken by currents flowing through the thin-film coil 22.

The insulating layers 11, 12, 13 are formed in such a way as to separate the thin-film coil 10 electrically from the surroundings. The insulating layer 11 is formed in such a way as to be filled up between the turns of the thin-film coil 10 and provide a cover around the thin-film coil 10. This insulating layer 11 is made of a non-magnetic insulating material such as a photoresist.

The insulating layer 12 is formed in such a way as to provide a cover around the insulating layer 11. This insulating layer 12 is made of a nonmagnetic material such as alumina.

The insulating layer 13 is formed in such a way as to give a cover to the thin-film coil 10 as well as the insulating layers 11, 12. This insulating layer 13 is made of a nonmagnetic material such as alumina.

The nonmagnetic layer 14 is formed of a nonmagnetic insulating material such as alumina, or a nonmagnetic electroconductive material such as ruthenium.

The main magnetic pole layer 40 has a primary function of implementing recording processing by receiving a magnetic recording magnetic flux produced at the thin-film coil 22 and releasing that magnetic flux toward the recording medium for implementing recording processing. More specifically, the main magnetic pole layer 40 is to generate a magnetic field (perpendicular magnetic field) to magnetize the recording medium in a direction orthogonal to its surface on the basis of a recording magnetic flux, thereby implementing recording processing in the perpendicular recording mode.

Such main magnetic pole layer 40 is located on the leading side of the thin-film coil, extending rearward from the air bearing surface 70, more specifically, as far as the back gap 50BG.

In the embodiment here, the main magnetic pole layer 40 has a structure where, as shown in FIG. 3, a main magnetic pole 15 and a magnetic pole main layer 19 are stacked one upon another in order and thereby coupled to each other.

The main magnetic pole 15 functions as a portion for releasing off a main writing magnetic flux. This main magnetic pole 15 extends rearward from the air bearing surface 70 on the leading side, more specifically, as far as the back gap 50BG.

As shown in FIG. 4, for instance, the main magnetic pole 15 is configured in a generally battledore type planar shape. To be more specific, the main magnetic pole 15 comprises, in order from the air bearing surface 70, a front end 15A that extends rearward from that air bearing surface 70 and having a constant width W1 for defining the recording track width of the recording medium and a rear end 15B that is linked to the rear of that front end 15A and having a width W4 greater than the width W1 (W4>W1). The position at which the width of the main magnetic pole 15 starts growing wide from the front end 15A (of width W1) toward the rear end 15B (of width W4) is a "flare point FP".

The front end 15A is primarily adapted to substantially release a recording magnetic flux produced at the thin-film coil 22 toward the recording medium, and has an exposed surface 15M exposed on the air bearing surface 70, as shown in FIG. 4.

As shown typically in FIG. 5, the exposed surface 15M takes a planar shape defined by an upper end edge (one end edge) E1 positioned on the trailing side, a lower end edge (another end edge) E2 positioned on the leading side, and two side end edges S1 and S2. To be more specific, the exposed surface 15M typically assumes on a trapezoidal shape with its width becoming gradually narrow from the trailing side toward the leading side (W1>W3). The trailing edge T1 of the front end 15A provides a substantial recording site of the magnetic pole layer 40.

The rear end 15B shown in FIG. 4 is adapted to receive the magnetic flux received in the magnetic pole main layer 19 and feed it to the front end 15A. Typically, the width of this rear end 15B remains constant (width W4) in the rear, and becomes gradually narrow from width W4 to width W1 in the front as the front end 15A comes near.

The magnetic pole main layer 19 functions as a portion adapted to receive a dominant magnetic flux. Typically, this magnetic pole main layer 19 extends rearward from a position P1 (the first position) receded from the air bearing surface 70.

As shown typically in FIG. 4, the magnetic pole main layer 19 has a rectangular planar shape of width W4.

The insulating layer 16 is provided to isolate the main magnetic pole 15 electrically from the surroundings. This insulating layer 16 is made of a nonmagnetic insulating material such as alumina.

The gap layer 17 is formed in such a way as to provide a gap for the magnetic separation of the magnetic layer 40 from the write shield layer 60.

The insulating layer 50 defines the throat height TH that is one of important determinants for the recording performance of the thin-film magnetic head, and is adapted to cover the thin-film coil 22 in such a way as to isolate it electrically from the surroundings.

As shown in FIG. 3, the insulating layer 50 has a structure wherein an auxiliary insulating layer 20 (the first insulating layer portion) formed in such a way as to substantially define the throat height TH and a main insulating layer 21 (the second insulating layer portion) formed in such a way as to substantially cover the thin-film coil 22 are stacked one upon another in that order.

As shown in FIG. 3, the auxiliary insulating layer 20 extends along the gap layer 17 and from a position receded from the air bearing surface 70, viz., a position P2 (the second position) between the air bearing surface 70 and a position P1 to the position P1 in the rear. And, the auxiliary insulating layer 20 is provided in such a way as to be adjacent to the magnetic pole main layer 19 at the position P1, and adjacent to the write shield layer 60 (the TH defining layer 18 to be described later) at the position P2. In the embodiment here in particular, the auxiliary insulating layer 20 defines a flat plane HM together with the magnetic pole main layer 19 and TH defining layer 18.

The aforesaid "position P2" is corresponding to the foremost end position of the insulating layer 50 (nearest to the air bearing surface 70). That is, there is a "zero throat height position TP" for defining the throat height TH. That throat height TH is a distance between the air bearing surface 70 and the zero throat height position TP. This auxiliary insulating layer 20 is made of a non-magnetic insulating material such as alumina. In the embodiment shown in FIGS. 3 and 4, the zero throat height position TP is in coincidence with the flare point FP.

As shown in FIG. 3, the main insulating layer 21 extends rearward from a position P3 (the third position) between the positions P1 and P2 while lying along the flat plane HM of the auxiliary insulating layer 20. More specifically, the main insulating layer 21 extends in such a way as not to fill up the back gap 50BG, and is receded from the auxiliary insulating layer 20. As shown typically in FIG. 3, this main insulating layer 21 comprises a main insulating layer portion 21A that is located as an underlay of the thin-film coil 22 on the flat plane HM of the auxiliary insulating layer 20, and a main insulating layer portion 21B that is located in such a way as to cover the thin-film coil 22 and the main insulating layer portion 21A around it.

The main insulating layer portion 21A is made of a non-magnetic material such as alumina.

The main insulating layer portion 21B is made of a non-magnetic insulating material such as a photoresist or spin-on-glass (SOG).

The thin-film coil 22 is formed for the generation of a recording magnetic flux. For instance, the thin-film coil 22 operates such that currents flow in the direction opposite to the direction taken by currents through the aforesaid thin-film coil 10.

The write shield layer 60 works capturing the spreading component of a recording magnetic flux released off the magnetic pole layer 40, thereby holding back the spreading of that magnetic flux.

The write shield layer 60 here comprises the TH defining layer 18 (the first magnetic shield layer portion) and a yoke layer 23 (the second magnetic shield layer portion) that are separate from each other, and has a structure wherein the TH defining layer 18 and yoke layer 23 are coupled to each other.

The TH defining layer 18 functions as a dominant magnetic flux inlet port adapted to capture an extra portion of the magnetic flux released directly from the magnetic pole.

The TH defining layer 18 is made of a magnetic material having a high saturation flux density such as permalloy or iron alloys, and assumes on a rectangular planar shape having a width W5 larger than the width W4 of the main magnetic pole layer 40 (W5>W4), as shown in FIG. 4.

The yoke layer 23 is set up in such a way as to function as a passage for the magnetic flux captured out of the TH defining layer 18, and function as a return yoke for allowing the magnetic flux to go back from the lining layer of the medium.

In the embodiment here, for instance, the yoke layer 23 extends as far as the rear of the back gap 50BG while linked to the main magnetic pole layer 40 at the back gap 50BG.

For such a thin-film magnetic head as described above, it is desired that constant dimensions defined on the basis of a specific component element be optimized to make sure recording performance, as typically shown in FIG. 3.

It is here noted that the whole structure of the thin-film magnetic head as described above is never limited to that described above, and so may be modified in various ways.

(Explanation of One Example of how the Thin-Film Magnetic Head Works)

Reference is now made to how the thin-film magnetic head according to the aforesaid embodiment works. The thin-film magnetic head records information in the recording medium by the recording head, and plays back the information recorded in the recording medium by the reproducing head.

At the reproducing head, the direction of a bias magnetic field applied by the bias magnetic field-applying layers 106 is orthogonal to a direction perpendicular to the medium opposite plane 70 (ABS 70). At the CPP-GMR device 500 with no signal magnetic field applied yet, the magnetization direction of the free layer 150 lies in the direction of the bias magnetic field, and the magnetization direction of the fixed magnetization layer 130 is fixed in a direction perpendicular to the medium opposite plane 70 (ABS 70).

At the CPP-GMR device 500, there is a change in the magnetization direction of the free layer 150 depending on a signal magnetic field from the recording medium, which in turn causes a change in the relative angle between the magnetization direction of the free layer 150 and the magnetization direction of the fixed magnetization layer 130, with the result that there is a change in the resistance value of the CPP-GMR device 500. The resistance value of the CPP-GMR device 500 may be found from a potential difference between the first and second shield layers, i.e., the two electrode layers 3 and 5 at the time when a sense current is passed through the MR device. It is thus possible for the reproducing head to play back the information recorded in the recording medium.

[Explanation of the Fabrication Process of the Thin-Film Magnetic Head]

Figure 6:
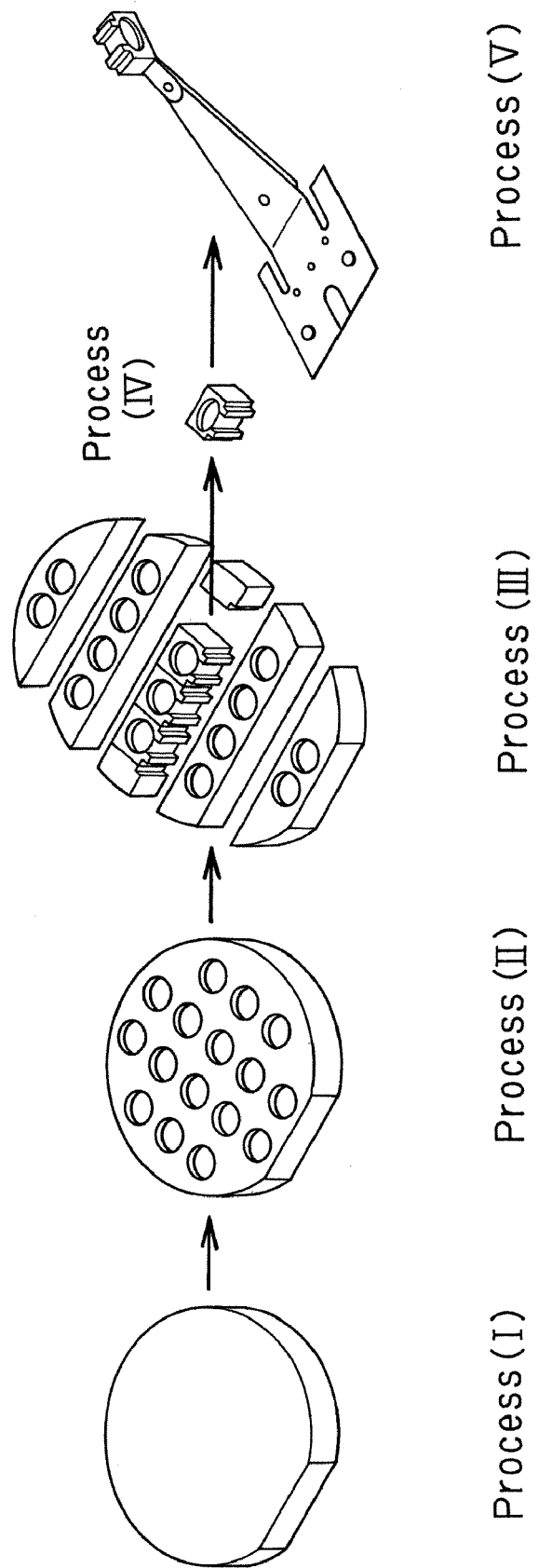
FIG. 6 is a schematic perspective view illustrative over time and in brief of head fabrication process steps.
Figure 7A:
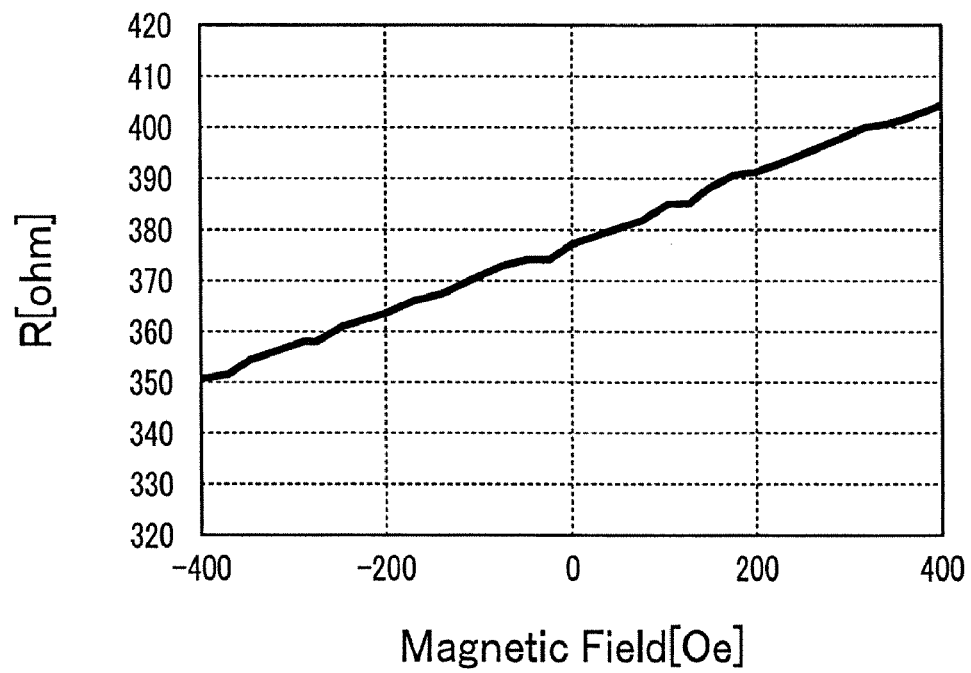
FIGS. 7A and 7B are graphs indicative of how typical thermal asperity deteriorations occur.
Figure 7B:
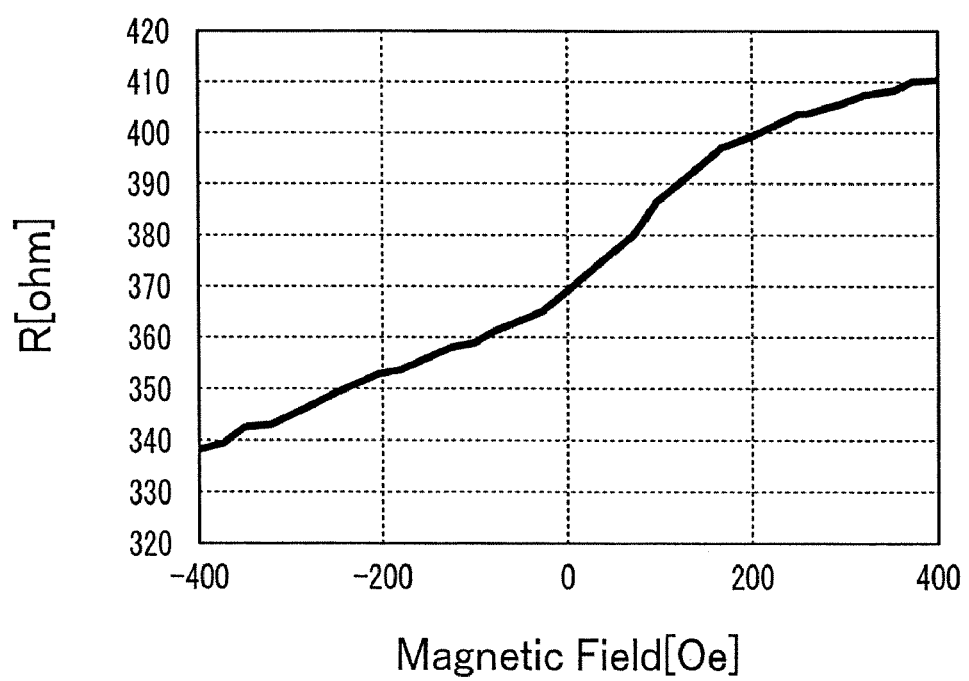

Such a thin-film magnetic head is usually fabricated via such thin-film magnetic head fabrication process steps as shown in FIG. 6. First, a wafer is readied up as the first process step (I).

Then, multilayer films forming the thin-film magnetic head as described above are formed on that wafer in order, and multiple head devices are processed and formed on one wafer (process step (II) of FIG. 6). In other words, there is a wafer shape formed, in which multiple magnetic-resistive effect devices are formed on the wafer.

Then, this wafer shape is cut out: multiple bar shapes are cut out of the wafer shape (process step (III) of FIG. 6).

Then, multiple device shapes are cut out of the bar shape to form a slider head device (one head device assembly) (process step (IV) of FIG. 6).

Then, the slider head device is attached to a gimbal into a head gimbal assembly (process step (V) of FIG. 6).

[Explanation of how to Estimate the Deteriorations of the Magneto-Resistive Effect Device by Heat Shocks According to the Invention]

To estimate the magneto-resistive effect device as described above in details, heat shocks are applied to it for deteriorations. Experiments intensively repeated by the inventors have confirmed that this estimation method is capable of imitating a state where the so-called thermal asperity defect is caused: it is a simple yet precise method that can imitate the so-called "local overheating plus vibration" deterioration mode.

In the invention, irradiation with lasers is used as the means for applying heat shocks to a structure. The aim of the invention is to apply heat shocks to the device, not to heat the device in its entirety. Accordingly in the invention, the device is irradiated with lasers for a very short time period to compare device characteristics before and after it. It is thus possible to simply yet precisely imitate the thermal asperity defect found as an inherent one in the thin-film magnetic head, thereby estimating its resistance to the thermal asperity.

As the device is locally irradiated with lasers for a very short time period, the applied heat propagates around. And then, local heat expansion propagates around together with the propagation of heat, doing damage to the device in the form of a heat shock.

In this regard, it is impeccable that the laser irradiation time be very short and that the laser be applied to an area of the magneto-resistive effect device to be estimated, from which the heat shock surely propagates to it. Therefore, the laser used here is preferably a pulse laser capable of radiating large output within a very short time. Even with a continuous laser used, a pseudo-pulse laser state may be created and used if a shutter mechanism is combined with it.

Preferably, the specific time of applying lasers to the structure is, for instance, 0.1 nsec. to 0.1 msec., and the specific laser energy applied to the structure is, for instance, 0.1 mW to 30 mW. The specifications and design for the laser irradiation time and applied laser energy may optionally be determined depending on the morphology of the device under test and the thermal asperity imitated.

The specific area of the structure irradiated with the laser preferably lies within a distance range of up to 200 μm from the magneto-resistive effect device to be estimated.

The laser may also be applied to the device in the presence of an applied magnetic field, in which case accelerated testing may be carried out because the magnetic field assists in deteriorations. Even in an actual thermal asperity, a media magnetic field is well likely to be applied to an unexpected place during collision: the application of laser collision would be reasonable as a thermal asperity imitating method. As a matter of course, the applied magnetic field is preferably small enough to cause the device not to break down at the applied magnetic field alone. As an example, an applied magnetic field of up to 600 Oe is preferable although varying with the head structure.

Referring here to the morphology of the structure to be subjected to laser collision, there is the mention of the wafer shape shown at the process step (II) of FIG. 6, wherein multiple magneto-resistive effect devices are formed on the water; multiple bar shapes cut out of the wafer shape, shown at the process step (III) of FIG. 6, wherein multiple magneto-resistive effect devices are formed on the wafer; and individual slider head devices individually cut out of the bar shape in device form, as shown at the process step (IV) of FIG. 6.

During the magnetic head fabrication, it is impeccable to detect sites having a head structure (magneto-resistive effect device) vulnerable to heat shocks at as an early fabrication stage as possible and remove right away the site likely to lead to a defective one.

From the standpoint of reproducibility very close to the state of heat shocks given to an actual device, preference is given to the slider head devices alone shown at the process step (IV) of FIG. 6. With the slider head devices alone shown at the process step (IV) of FIG. 6, however, it is difficult to estimate large amounts of them rapidly, and estimation at this stage is far beyond the object of early detection at an early fabrication stage.

Taken altogether, the most preferable structure to be estimated is the bar shape shown at the process step (III) of FIG. 6, but, of course, the wafer shape shown at the process step (II) of FIG. 6 and the slider head devices shown at the process step (IV) of FIG. 6 are not excluded from the structure to be estimated by the invention. The head gimbal assembly shown at the process step (V) of FIG. 6 is also embraced.

When the aforesaid estimation operation is used to estimate resistance to the thermal asperity, it is desired that the device be measured before and after it to compare the device characteristics before and after it. The characteristics to check, for instance, are the resistance, output, asymmetry, nonlinearity, etc. of the magneto-resistive effect device. As already noted, most of the thermal asperity deteriorations of the design today are an increasing output mode; however, deteriorations of other modes are plausible and indeed occur. Changes of these characteristics are measured before and after the application of heat shocks, and such changes are investigated to check characteristics deteriorations. The check of such characteristics deteriorations is preferably carried out especially in the form of the bar shape shown at the process step (III) of FIG. 6. Pulse lasers are directed in order and in quick succession to a row of devices lying in the bar shape in order to apply heat shocks to them to measure device characteristics successively and continuously before and after the application of heat shocks. If this is done, efficiency and operability upon measurements are much more improved.

Data amassed on the basis of the check-up operation of such characteristics deteriorations are fed back to, and used for, designing such devices as mentioned below, and fabricating thin-film magnetic heads, and so on.

On actually running fabrication lines, rejects poor in resistance to heat shocks as well as rejects poor in initial characteristics may as well be detected. It is then not imperative which of the shock resistance or the initial characteristics is responsible for poor characteristics; hence, it is not always necessary to measure them before the application of laser shocks.

Data amassed on the basis of the check-up operation of such characteristics deteriorations are fed back to, and used for, designing such devices as mentioned below, and fabricating thin-film magnetic heads, and so on.

(a) They are used for revamping the structure, material selection, etc. of magneto-resistive effect devices excelling in resistance to heat shocks.

(b) For the wafer shape shown at the process step (II) of FIG. 6, and the bar shape shown at the process step (III) of FIG. 6, they are used to draw a defect map of each device measured, and the gleaned information is fed back to the cutting step for each device such that only conforming devices are used as products, thereby improving the reliability of the products.

For an estimation system for implementing the aforesaid estimation method of estimating the deteriorations of magneto-resistive effect devices by heat shocks according to the invention, it is only needed to have such requirements as mentioned below.

That is, the estimation system for the deteriorations of magneto-resistive effect devices by heat shocks may as well be built up of a heat shock application means for applying a laser to a structure including a thin-film magnetic head comprising a magneto-resistive effect device to give a heat shock to the magneto-resistive effect device, and a characteristics estimation means for measuring and comparing a characteristics change of the magneto-resistive effect device before and after the application of the heat shock, thereby checking the presence or absence of deteriorations.

Explanation of the Specific Experimental Example

A laser was applied to a device in a bar state to estimate its characteristics before and after the application of the laser.

Laser power was about 1 mW, the application time was about 1 nsec., and the applied area was about 1×1 µm$^2$. The laser was applied to each device in such a way that the whole reader device was irradiated from the ABS of each device with the laser. QST (quasi-static testing) was carried out for the measurement of the device characteristics before and after laser irradiation. The applied magnetic field was 600 Oe, and the measuring voltage was 150 mV.

Figure 8A:
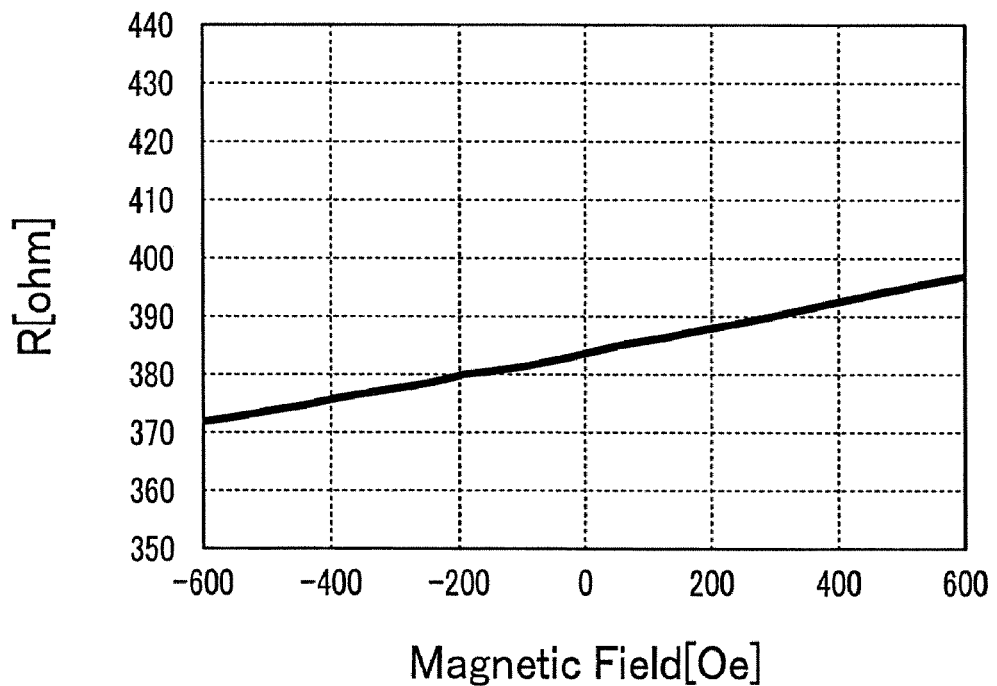
FIGS. 8A and 8B are indicative of the device QST waveforms obtained before and after laser irradiation.
Figure 8B:
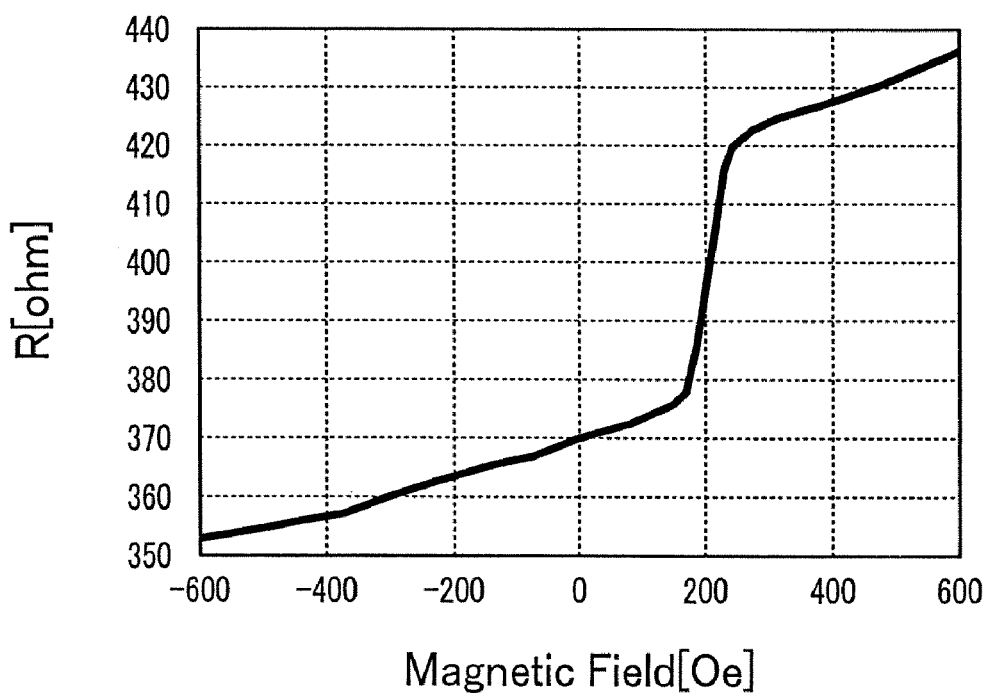

The results of measurement are shown in FIGS. 8A and 8B indicative of the QST waveforms of the device before and after the application of the laser. FIG. 8A is indicative of a state before the application of the laser, and FIG. 8B are indicative of a state after the application of the laser. A telling stepwise resistance change (kink) is observed in FIG. 8B—after the application of the laser shock, but not in FIG. 8A—before the application of the laser shock.

As already noted, the kink is the mode that is most often found in the thermal asperity defect in practical HDDs, showing that the application of the laser according to the invention can well imitate the practical thermal asperity.

From the aforesaid results of experimentation, the advantages of the invention would be undisputed. That is, the estimation method of the invention can well imitate the "local overheating plus vibration" deterioration mode phenomenon in a simple yet very approximate state, so that a device likely to undergo characteristics deteriorations due to the thermal asperity problem can be detected early at an initial fabrication process stage, and what specifications a head device structure less likely to offer the thermal asperity problem is in can be judged at a product development stage.

Referring to the industrial applicability of the invention, the invention could be used in the industry of magnetic disk systems comprising a magneto-resistive effect device for reading the magnetic field strength of a magnetic recording disk or the like as signals.

What we claim is:

1. A method for estimating deterioration of a magneto-resistive effect device by imitating a thermal asperity defect condition in said device, comprising:
   applying a heat shock by pulse laser irradiation having an irradiating time of about 0.1 nsec to about 0.1 msec, and laser energy of 0.1 mW to 30 mW, to a structure including a thin film magnetic head having a magneto-resistive effect device, the heat shock being applied to an area of the structure within a distance range of up to 200 µm from the magneto-resistive effect device, to propagate the heat shock to the magneto-resistive effect device, thereby causing deterioration of the magneto-resistive effect device.

2. The estimation method according to claim 1, further comprising:
   detecting a deterioration of said magneto-resistive effect device depending on characteristics of said device after said deterioration.

3. The estimation method according to claim 1, further comprising:
   estimating a resistance of said magneto-resistive effect device to a thermal asperity defect condition depending on changes in device characteristics before and after said magneto-resistive effect device deterioration.

4. The estimation method according to claim 1, further comprising:
   applying said magneto-resistive effect device deterioration to a wafer shape in which multiple magneto-resistive effect devices are formed on a wafer.

5. The estimation method according to claim 1, further comprising:
   applying said magneto-resistive effect device deterioration to a bar shape in which multiple bars are cut out of a wafer shape in which multiple magneto-resistive effect devices are formed on a wafer.

6. The estimation method according to claim 1, further comprising:
   applying said magneto-resistive effect device deterioration to a slider head apparatus in which multiple device shapes are cut out of a bar shape.

7. The estimation method according to claim 1, further comprising:
   applying said heat shock by pulse laser irradiation in the presence of an applied magnetic field having a magnetic field strength of up to 600 Oe.

8. The estimation method according to claim 7, wherein the applied magnetic field has a magnetic field strength of between 200 Oe and 600 Oe.

* * * * *